United States Patent
Kanbayashi

(10) Patent No.: US 7,296,203 B2
(45) Date of Patent: Nov. 13, 2007

(54) TEST APPARATUS, PROGRAM AND RECORDING MEDIUM

(75) Inventor: Hironori Kanbayashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 12 days.

(21) Appl. No.: 11/247,988

(22) Filed: Oct. 11, 2005

(65) Prior Publication Data

US 2007/0083801 A1    Apr. 12, 2007

(51) Int. Cl.
G01R 31/28   (2006.01)
G06F 11/00   (2006.01)

(52) U.S. Cl. ........................ 714/731; 714/744

(58) Field of Classification Search ............... None
See application file for complete search history.

(56) References Cited

U.S. PATENT DOCUMENTS

| | | | | |
|---|---|---|---|---|
| 6,452,421 B2 * | 9/2002 | Saito | ............... | 326/93 |
| 6,813,724 B2 * | 11/2004 | Saito | ............... | 713/401 |
| 6,820,234 B2 * | 11/2004 | Deas et al. | ............... | 714/814 |
| 6,948,098 B2 * | 9/2005 | Pillay et al. | ............... | 714/34 |

FOREIGN PATENT DOCUMENTS

| | | |
|---|---|---|
| JP | 402174417 A * | 7/1990 |
| JP | 2004-239754 | 8/2004 |
| WO | WO-2005/093443 | 10/2005 |

OTHER PUBLICATIONS

Japanese Search Report issued in PCT/JP2006/320124 dated Dec. 18, 2006 (4 pages).
English Translation of Japanese Search Report issued in PCT/JP2006/320124 dated Dec. 18, 2006 (4 pages).

* cited by examiner

*Primary Examiner*—Cynthia Britt
(74) *Attorney, Agent, or Firm*—Osha Liang LLP

(57) ABSTRACT

There is provided a test apparatus for testing a device-under-test, having a master channel provided in correspondence to one of output pins of the device-under-test to sample an output signal of the corresponding output pin and a slave channel provided in correspondence to a different output pin from that of the master channel to sample an output signal of the corresponding output pin, wherein the master channel has a frequency divider for generating a frequency-divided clock by dividing a source synchronous clock outputted from the device-under-test, a sampling section for sampling the corresponding output signal based on the frequency-divided clock and a distributing section for distributing the frequency-divided clock to the slave channel, and the slave channel has a sampling section for sampling the corresponding output signal based on the frequency-divided clock received from the master channel.

7 Claims, 5 Drawing Sheets

TEST APPARATUS, PROGRAM AND RECORDING MEDIUM

BACKGROUND OF THE INVENTION

1. Field of the Invention

The present invention relates to a test apparatus for testing a device-under-test such as a semiconductor circuit, a program for operating the test apparatus and a recording medium for storing the program. More specifically, the invention relates to a test apparatus having a plurality of channels for receiving output signals outputted from the device-under-test.

2. Related Art

Conventionally, as a test apparatus for testing a device-under-test, there has been known a test apparatus having a plurality of channels for receiving output signals outputted from the device-under-test. Each of the channels is provided in correspondence to a plurality of output pins of the device-under-test to receive the output signal outputted from the corresponding output pin. Each channel also samples the received output signal and the test apparatus judges whether the device-under-test is defect-free based on the sampling result.

In sampling the output signal in each channel, there has to be a desirable phase difference to the output signal in the sampling timing. In detecting edges of the output signal for example, a phase difference between a sampling clock and the output signal is sequentially changed.

To that end, the test apparatus uses a source synchronous clock outputted from the device-under-test in synchronism with the output signal to sample the output signal. For example, the test apparatus generates a sampling clock synchronized with the source synchronous clock and delays the sampling clock corresponding to a desirable phase difference. Thereby, the test apparatus generates the sampling clock having the desirable phase difference to the output signal.

Still more, because the sampling of the output signal is carried out in each channel, the source synchronous clock is fed also to each channel. In the conventional test apparatus, the source synchronous clock is fed to a master channel among the plurality of channels of the test apparatus and is then distributed sequentially from the master channel to each of slave channels connected in cascade.

However, because the channels are connected each other by connectors, cables and the like, a frequency band of signal capable of passing such connection route is limited due to parasitic capacity and others of the connection route. Therefore, it has been difficult to accurately distribute the source synchronous clock to the slave channels when frequency of the source synchronous clock is high.

The frequency band of the connector connecting the channels is around 1 GHz, so that it has been difficult to pass the source synchronous clock outputted from a semiconductor chip of these days whose speed is being remarkably increased in particular. Therefore, it has been difficult to distribute the source synchronous clock to the slave channels and to test the device-under-test accurately.

SUMMARY OF THE INVENTION

Accordingly, it is an object of the invention to provide a test apparatus, a program and a recording medium capable of solving the above-mentioned problems. This object may be achieved through the combination of features described in independent claims of the invention. Dependent claims thereof specify preferable embodiments of the invention.

In order to solve the above-mentioned problems, according to a first aspect of the invention, there is provided a test apparatus for testing a device-under-test, having a master channel provided in correspondence to one of output pins of the device-under-test to sample an output signal of the corresponding output pin and a slave channel provided in correspondence to a different output pin from that of the master channel to sample an output signal of the corresponding output pin, wherein the master channel has a frequency divider for generating a frequency-divided clock by dividing a source synchronous clock outputted from the device-under-test, a sampling section for sampling the corresponding output signal based on the frequency-divided clock and a distributing section for distributing the frequency-divided clock to the slave channel, and the slave channel has a sampling section for sampling the corresponding output signal based on the frequency-divided clock received from the master channel.

The sampling section of the master channel may sample the corresponding output signal corresponding to the frequency-divided clock. The test apparatus may further include a connector for passing the frequency-divided clock from the master channel to the slave channel and a frequency dividing control section for setting a frequency dividing ratio in the frequency divider so that frequency of the frequency-divided clock falls within a frequency band of a signal that can be passed by the connector.

The frequency dividing control section may have a characteristic storage section for storing the frequency band of the connector in advance, a frequency measuring section for measuring frequency of the source synchronous clock and a control section for controlling the frequency dividing ratio in the frequency divider based on the frequency band stored in the characteristic storage section and the frequency measured by the frequency measuring section.

The test apparatus may further include a plurality of slave channels connected in series, each of the slave channels may have a distributing section for passing the received frequency-divided clock to the succeeding slave channel and each of the distributing section of the master channel and slave channels may shape waveform of the received frequency-divided clock. The test apparatus may include the plurality of slave channels connected in series and the control section may control the frequency dividing ratio in the frequency divider based also on a number of the slave channels connected in series.

According to a second aspect of the invention, there is provided a program for operating a test apparatus for testing a device-under-test as a master channel provided in correspondence to one of output pins of the device-under-test to sample an output signal of the corresponding output pin and as a slave channel provided in correspondence to a different output pin from that of the master channel to sample an output signal of the corresponding output pin, operating the master channel as a sampling section for sampling the corresponding output signal based on a source synchronous clock outputted from the device-under-test, a frequency divider for generating a frequency-divided clock by dividing the source synchronous clock and a distributing section for distributing the frequency-divided clock to the slave channel and operating the slave channel as a sampling section for sampling the corresponding output signal based on the frequency-divided clock received from the master channel.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
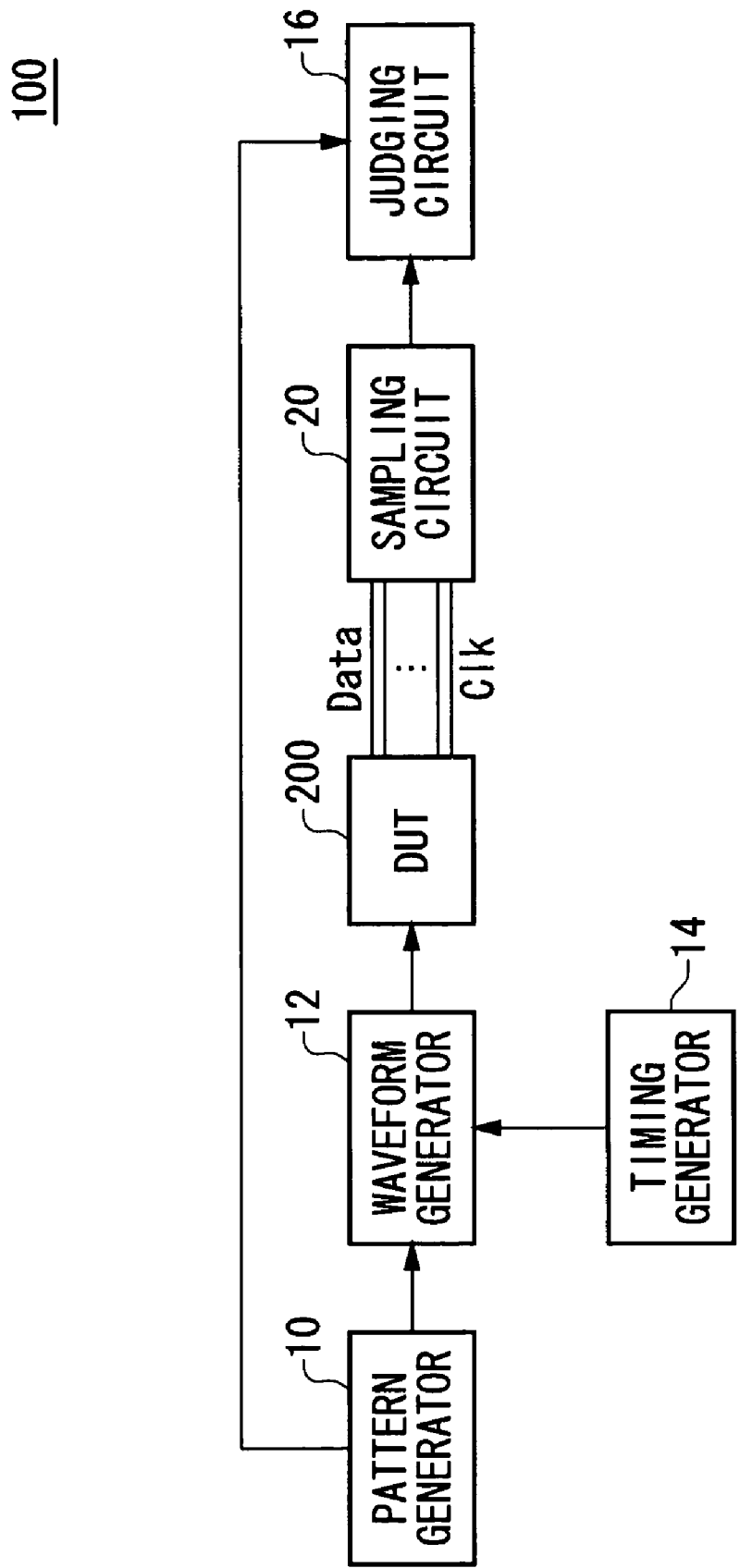
FIG. 1 is diagram showing one exemplary configuration of a test apparatus according to an embodiment of the invention.

FIG. 1 is diagram showing one exemplary configuration of a test apparatus 100 according to an embodiment of the invention. The test apparatus 100 for testing a device-under-test 200 such as a semiconductor circuit has a pattern generator 10, a waveform generator 12, a timing generator 14, a sampling circuit 20 and a judging circuit 16.

The pattern generator 10 generates a test pattern for testing the device-under-test 200. The waveform generator 12 feeds a test signal formed based on the test pattern generated by the pattern generator 10 and a timing signal fed from the timing generator 14 to the device-under-test 200.

The sampling circuit 20 samples an output signal outputted from the device-under-test 200. In the present embodiment, the sampling circuit 20 samples the output signals outputted from a plurality of output pins of the device-under-test 200 based on a source synchronous clock outputted from the device-under-test 200. The source synchronous clock is synchronized with the output signal.

The judging circuit 16 judges whether the device-under-test 200 is defect-free based on the sampling result in the sampling circuit 20. For example, the judging circuit 16 judges whether the device-under-test 200 is defect-free by comparing the sampling result in the sampling circuit 20 with an expected value signal fed from the pattern generator 10.

Figure 2:
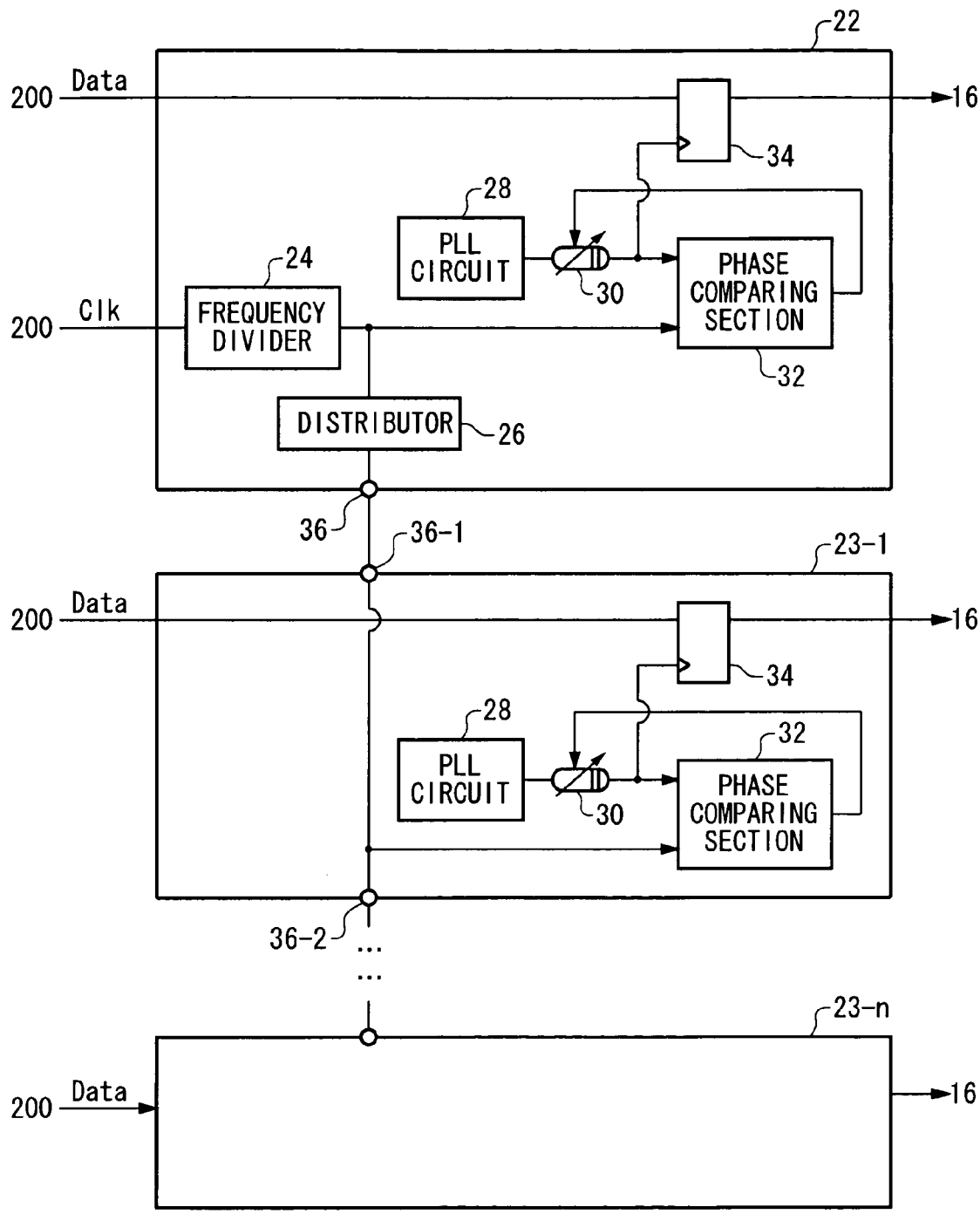
FIG. 2 is a diagram showing one exemplary configuration of a sampling circuit.

FIG. 2 is a diagram showing one exemplary configuration of the sampling circuit 20. The sampling circuit 20 has a master channel 22 and a plurality of slave channels 23-1 through 23-n (referred to 23 in general hereinafter). The master channel 22 and the plurality of slave channels 23 are provided in correspondence to the plurality of output pins of the device-under-test 200 to sample the output signals outputted from the respective corresponding output pins. The master channel 22 also receives the source synchronous clock outputted from the device-under-test 200. In this example, the plurality of slave channels 23 is connected with the master channel 22 in cascade. That is, either one of the slave channels 23 connects with the master channel 22, and the other slave channels 23 connect sequentially in series.

The master channel 22 has a frequency divider 24, a distributing section 26, a PLL circuit 28, a variable delay circuit 30, a phase comparing section 32, a sampling section 34 and a connector 36. The frequency divider 24 receives the source synchronous clock and divides it to generate a frequency-divided clock. That is, the frequency divider 24 generates the frequency-divided clock having a period of the source synchronous clock multiplied by a frequency-dividing ratio.

The PLL circuit 28 generates a sampling clock having predetermined frequency. For example, the PLL circuit 28 generates the sampling clock having the almost same frequency with the source synchronous clock. A user of the test apparatus may set the frequency in the PLL circuit 28 in advance.

The variable delay circuit 30 delays and outputs the sampling clock outputted from the PLL circuit 28. The phase comparing section 32 compares phase of the sampling clock outputted from the variable delay circuit 30 with phase of the frequency-divided clock outputted from the frequency divider 24 to control the delay of the variable delay circuit 30 based on the comparison result.

For example, when skew in the sampling clocks in the master channel 22 and the slave channel 23 is to be reduced, the phase comparing section 32 controls the delay in the variable delay circuit 30 based on a phase difference between the sampling clock and the frequency divided clock so as to reduce it. Still more, based on a phase difference which the sampling clock should have against the output signal, the phase comparing section 32 may control the delay in the variable delay circuit 30 so that the phase difference of the sampling clock and the frequency-divided clock coincides with such phase difference. Such control allows the output signal to be sampled with desirable timing.

The sampling section 34 samples the corresponding output signal based on the frequency-divided clock outputted from the frequency divider 24. In this example, the PLL circuit 28, the variable delay circuit 30 and the phase comparing section 32 generate the sampling clock based on the frequency-divided clock and the sampling section 34 samples the output signal based on the sampling clock outputted from the variable delay circuit 30. Here, the sampling section 34 is a flip-flop that takes in data of the output signal corresponding to the sampling clock.

The distributing section 26 distributes the frequency-divided clock outputted from the frequency divider 24 to the slave channel 23 connected via the connector 36. The distributing section 26 may also shape the waveform of the frequency-divided clock in distributing it to the slave channel 23. The connector 36 connects the master channel 22 with the slave channel 23 to transmit the frequency-divided clock to the slave channel 23.

Each of the slave channels 23 has the PLL circuit 28, the variable delay circuit 30, the phase comparing section 32, the sampling section 34 and a plurality of connectors 36-1 and 36-2. Operations of the PLL circuit 28, the variable delay circuit 30 and the sampling section 34 are the same with those of the PLL circuit 28, the variable delay circuit 30 and the sampling section 34 in the master channel 22.

The connector 36-1 is connected with a connector 36 of the upper channel to receive the frequency-divided clock. The phase comparing section 32 receives the frequency-divided clock via the connector 36-1 and controls a delay in the variable delay circuit 30 based on a phase difference of the frequency-divided clock and the sampling clock outputted from the variable delay circuit 30. The connector 36-2 is connected with a connector 36 of the lower channel to transmit the frequency-divided clock to the lower channel.

Because the sampling circuit 20 of the present embodiment distributes the frequency-divided clock obtained by dividing the source synchronous clock to the slave channels 23, the low frequency clock may be distributed to the slave channels 23. Therefore, the clock may be distributed even if a frequency band of the route for connecting the channels is low. Still more, the phase comparing section 32 synchronizes the frequency-divided clock with the sampling clock. Accordingly, the sampling clock synchronized with the source synchronous clock may be generated.

The frequency-dividing ratio in the frequency divider 24 may be also set based on the frequency band of the route connecting the channels. For example, the frequency dividing ratio may be set after detecting the frequency of the given source synchronous clock so that the frequency of the frequency-divided clock obtained by dividing the source synchronous clock matches with the frequency band of the route.

Figure 3:
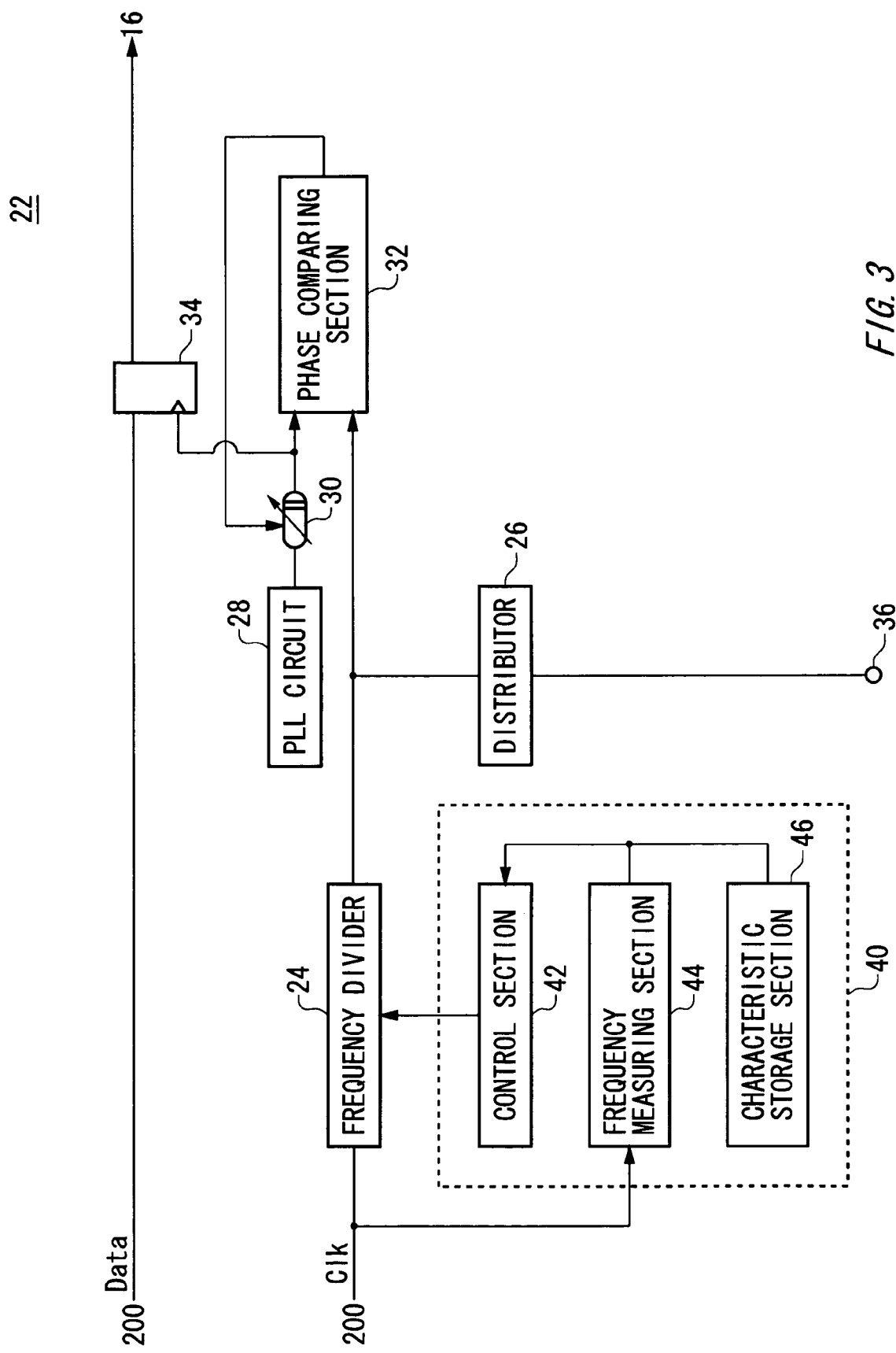
FIG. 3 is a diagram showing another exemplary configuration of a master channel.

FIG. 3 is a diagram showing another exemplary configuration of the master channel 22. In addition to the configuration of the master channel 22 explained in FIG. 2, the master channel 22 of this example has a frequency dividing control section 40. The frequency dividing control section 40 sets the frequency dividing ratio in the frequency divider 24.

For example, the frequency dividing control section 40 sets the frequency dividing ratio in the frequency divider 24 so that the frequency of the frequency-divided clock outputted from the frequency divider 24 falls within the frequency band of the signal that can be passed by the connector 36. In this case, the frequency dividing control section 40 sets the frequency dividing ratio based on the frequency of the source synchronous clock outputted from the sampling circuit 20 and the frequency band of the connector 36. The frequency dividing control section 40 has information regarding the frequency band of the connector 36 given in advance from the user. The frequency dividing control section 40 may also receive information regarding the frequency of the source synchronous clock in advance from the user or may measure the frequency of the source synchronous clock.

The frequency dividing control section 40 of the present embodiment has a control section 42, a frequency measuring section 44 and a characteristic storage section 46. The characteristic storage section 46 stores the frequency band of the connector 36 in advance. The user may give the frequency band of the connector 36 in advance.

The frequency measuring section 44 measures the frequency of the source synchronous clock. For example, the frequency measuring section 44 has means for measuring frequency of an inputted signal and receives the branched source synchronous clock. The control section 42 controls the frequency dividing ratio in the frequency divider 24 based on the frequency characteristics of the connector 36 stored in the characteristic storage section 46 and the frequency of the source synchronous clock measured by the frequency measuring section 44.

For example, the frequency of the frequency-divided clock outputted from the frequency divider 24 is a value obtained by dividing the frequency of the source synchronous clock by the frequency dividing ratio in the frequency divider 24. The control section 42 controls the frequency-dividing ratio so that the frequency of the pertinent frequency-divided clock falls within the frequency band of the connector 36. Such configuration allows the master channel 22 to set the frequency-dividing ratio for generating the frequency-divided clock having the adequate frequency. Preferably, the control section 42 sets the frequency dividing ratio so that the frequency of the frequency-divided clock falls and is maximized within the frequency band of the connector 36.

The control section 42 may control the frequency dividing ratio in the frequency divider 24 based also on a number of the slave channels 23 connected in series. When the slave channels 23 are connected in series, the transmission route for transmitting the frequency-divided clock is prolonged, so that the frequency band of the transmission route becomes narrow. However, the control section 42 of the present embodiment controls the frequency of the frequency-divided clock corresponding to the length of the transmission route, so the frequency-divided clock having more adequate frequency may generated. In this case, it is preferable for the control section 42 to receive the relationship of the number of the slave channels 23 with the adequate frequency of the frequency-divided clock in advance.

Figure 4:
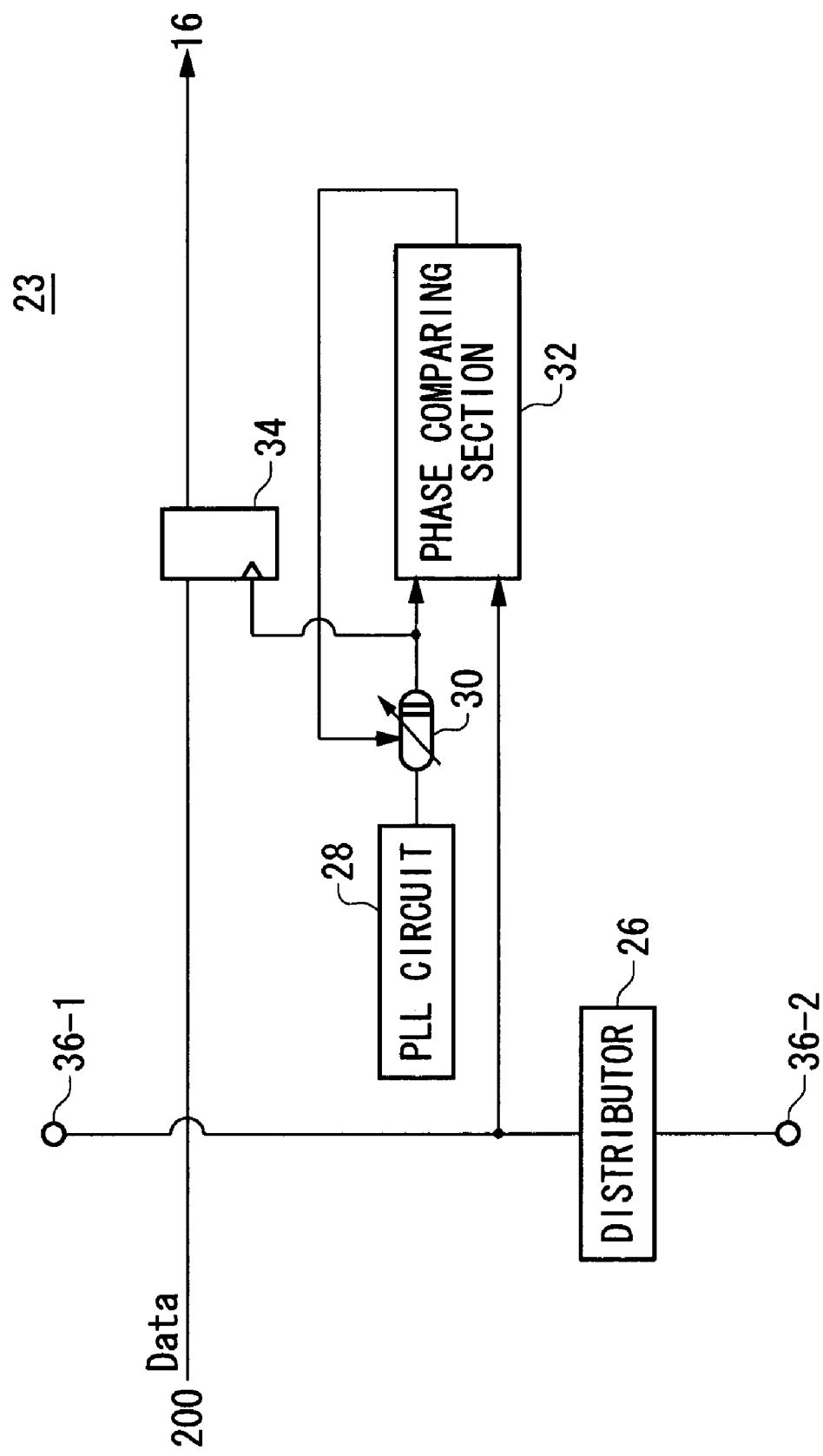
FIG. 4 is a diagram showing another exemplary configuration of a slave channel.

FIG. 4 is a diagram showing another exemplary configuration of the slave channel 23. In addition to the configuration of the slave channel 23 explained in FIG. 2, the slave channel 23 of the present embodiment has a distributing section 26. The distributing section 26 is provided between the connectors 36-1 and 36-2 to pass the frequency-divided clock to the succeeding slave channel 23. The distributing section 26 also shapes and outputs waveform of the frequency-divided clock received from the preceding channel. For example, the distributing section 26 corrects rounding of the waveform of the frequency-divided clock and also removes noise components superimposed on the frequency-divided clock. Such configuration allows the frequency-divided clock from which the deterioration of waveform has been reduced to be passed sequentially to the plurality of slave channels 23.

Figure 5:
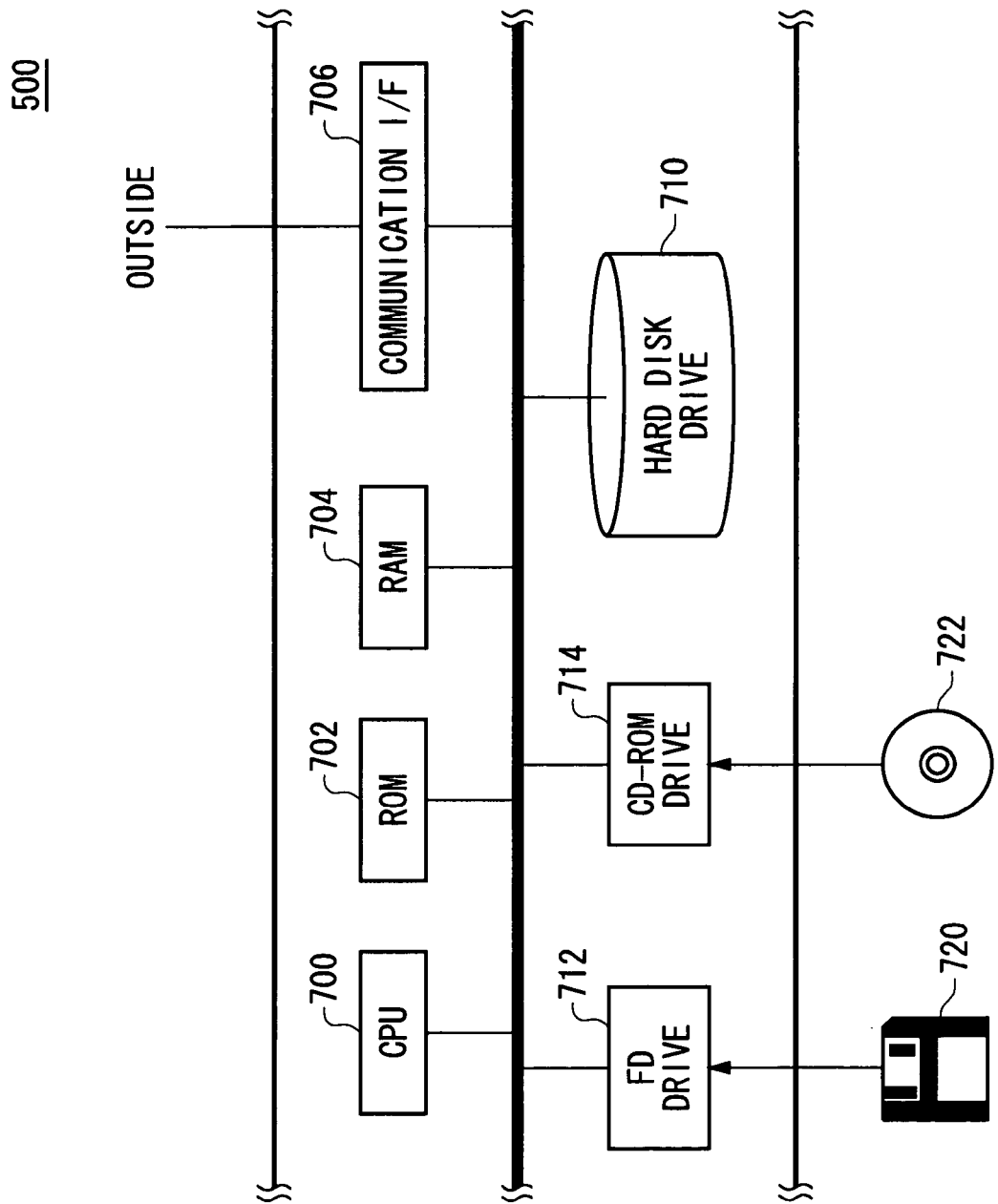
FIG. 5 is a diagram showing one exemplary configuration of a computer for operating the test apparatus.

FIG. 5 is a diagram showing one exemplary configuration of a computer 500 for operating the test apparatus 100. In this example, the computer 500 stores programs for operating the test apparatus 100 as explained in FIGS. 1 through 4. The computer 500 has a CPU 700, a ROM 702, a RAM 704, a communication interface 706, a hard disk drive 710, a FD drive 712 and a CD-ROM drive 714. The CPU 700 operates based on the programs stored in the ROM 702, the RAM 704, the hard disk drive 710, the flexible disk 720 and/or the CD-ROM 722.

For example, the program for operating the test apparatus 100 operates the test apparatus 100 as the pattern generator 10, the waveform generator 12, the timing generator 14, the sampling circuit 20 and the judging circuit 16 as explained in FIGS. 1 through 4. The communication interface 706 communicates with the test apparatus 100 for example to control the test apparatus 100.

The hard disk drive 710 as one example of the storage unit stores preset information and the program for operating the CPU 700. The ROM 702, the RAM 704 and/or the hard disk drive 710 store the programs for operating the test apparatus 100 as the test apparatus 100 explained in connection with FIGS. 1 through 4. The programs may be stored also in the flexible disk 720, the CD-ROM 722 and others.

The FD drive 712 reads the program from the flexible disk 720 to provide to the CPU 700. The CD-ROM drive 714 reads the program from the CD-ROM 722 to provide to the CPU 700.

The program may be directly read from the recording medium to a RAM for the execution or may be once installed in the hard disk drive and be read to the RAM for the execution. Still more, the programs may be stored in a single recording medium or be stored in a plurality of recording mediums. The programs stored in the recording mediums may provide the respective functions in cooperation with an operating program. For example, the programs may be what relies on the operating system to carry out a part or whole of a function and provides the function based on a response from the operating system.

As the recording medium for storing the programs, it is also possible to use optical recording mediums such as DVD and PD, magneto-optical recording mediums such as MD, a taped medium, magnetic recording mediums and semiconductor memories such as IC card and miniature card, beside the flexible disk and the CD-ROM. Still more, storage units such as a hard disk or a RAM provided in a server system connected with a private communication network or Internet may be used as the recording medium.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As it is apparent from the above description, according to the invention, the frequency-divided clock obtained by dividing the source synchronous clock is distributed to the slave channels, so that the low frequency clock may be distributed to the slave channels. Therefore, even if the frequency band of the route connecting the channels is low, the clock synchronized with the source synchronous clock of high frequency may be distributed. Still more, the frequency-divided clock is synchronized with the sampling clock in the respective phase comparing sections. Accordingly, the sampling clock synchronized with the source synchronous clock may be generated.

What is claimed is:

1. A test apparatus for testing a device-under-test, comprising:
    a master channel provided in correspondence to one of output pins of said device-under-test to sample an output signal of said corresponding output pin; and
    a slave channel provided in correspondence to a different output pin from that of said master channel to sample an output signal of said corresponding output pin; wherein
    said master channel has;
        a frequency divider for generating a frequency-divided clock by dividing a source synchronous clock outputted from said device-under-test so that the frequency-divided clock has a period of the source synchronous clock multiplied by a predetermined ratio;
        a sampling section for sampling said corresponding output signal based on said frequency-divided clock; and
        a distributing section for distributing said frequency-divided clock to said slave channel; and
    said slave channel has a sampling section for sampling said corresponding output signal based on said frequency-divided clock received from said master channel.

2. The test apparatus as set forth in claim 1, wherein said sampling section of said master channel samples said corresponding output signal corresponding to said frequency-divided clock.

3. The test apparatus as set forth in claim 1, further comprising:
    a connector for passing said frequency-divided clock from said master channel to said slave channel; and
    a frequency dividing control section for setting a frequency dividing ratio in said frequency divider so that frequency of said frequency-divided clock falls within a frequency band of a signal that can be passed by said connector.

4. The test apparatus as set forth in claim 3, wherein said frequency dividing control section has a characteristic storage section for storing said frequency band of said connector in advance;
    a frequency measuring section for measuring frequency of said source synchronous clock; and
    a control section for controlling the frequency dividing ratio in said frequency divider based on said frequency band stored in said characteristic storage section and said frequency measured by said frequency measuring section.

5. The test apparatus as set forth in claim 4, comprising a plurality of said slave channels connected in series, wherein said control section controls the frequency dividing ratio in said frequency divider based also on a number of said slave channels connected in series.

6. The test apparatus as set forth in claim 1, further comprising a plurality of slave channels connected in series;
    each of said slave channels has a distributing section for passing said received frequency-divided clock to said succeeding slave channel; and
    each of said distributing section of said master channel and slave channels shapes waveform of said received frequency-divided clock.

7. A recording medium for storing a program for operating that when executed would cause a test apparatus for testing a device-under-test to function as follows:
    a master channel provided in correspondence to one of output pins of said device-under-test to sample an output signal of said corresponding output pin; and
    a slave channel provided in correspondence to a different output pin from that of said master channel to sample an output signal of said corresponding output pin,
    wherein said master channel functions as follows:
        a sampling section for sampling said corresponding output signal based on a source synchronous clock outputted from said device-under-test;
        a frequency divider for generating a frequency-divided clock by dividing said source synchronous clock so that the frequency-divided clock has a period of the source synchronous clock multiplied by a predetermined ratio; and
        a distributing section for distributing said frequency-divided clock to said slave channel, and
    said slave channel functions as follows:
        a sampling section for sampling said corresponding output signal based on said frequency-divided clock received from said master channel.

* * * * *